United States Patent

Brunelle

[11] Patent Number: 6,125,336
[45] Date of Patent: Sep. 26, 2000

[54] APPARATUS FOR DEVICE QUALIFICATION

[75] Inventor: Steven J. Brunelle, Boise, Id.

[73] Assignee: Micron Electronics, Inc., Nampa, Id.

[21] Appl. No.: 09/017,790

[22] Filed: Feb. 3, 1998

[51] Int. Cl.[7] .......................... B07C 5/344; H05K 13/00
[52] U.S. Cl. .......................... 702/123; 702/81; 702/118
[58] Field of Search .................... 714/718, 723; 702/81, 82, 84, 117, 118

[56] References Cited

U.S. PATENT DOCUMENTS

| 5,030,905 | 7/1991 | Figal | 324/158 R |
| 5,538,141 | 7/1996 | Gross, Jr. et al. | 209/571 |
| 5,603,412 | 2/1997 | Gross, Jr. et al. | 209/571 |
| 5,798,653 | 8/1998 | Leung, Jr. | 324/760 |
| 5,822,256 | 10/1998 | Bauer et al. | 365/200 |
| 5,867,505 | 2/1999 | Beffa | 371/21.1 |
| 5,895,443 | 4/1999 | Gross, Jr. et al. | 702/120 |

*Primary Examiner*—Patrick Assouad
*Attorney, Agent, or Firm*—Knobbe, Martens, Olson & Bear, LLP

[57] ABSTRACT

A batch of devices is installed in a handler of a tester. A known qualification test is executed on the batch of devices to determine a first resultant binout. The resultant binout for the batch is stored. Without displacing the devices, a trial qualification test is executed on the batch of devices in the handler of the tester to determine a second resultant binout. The first resultant binout is compared to the second resultant binout for each device of the batch of devices. For example, each device may be categorized as either a correlating part, an upgraded part or a downgraded part.

15 Claims, 2 Drawing Sheets

APPARATUS FOR DEVICE QUALIFICATION

RELATED APPLICATION

The subject matter of the U.S. patent application entitled METHOD OF DEVICE QUALIFICATION, filed on Feb. 3, 1998, Application Ser. No. 09/017,792, and having attorney Docket Number MPATENT.107A contains related subject matter.

BACKGROUND OF THE INVENTION

1. Field of the Invention

The invention relates to device testing. More particularly, the invention relates to improved semiconductor device qualification testing.

2. Description of the Related Art

Semiconductor device fabrication is a complex process. During fabrication, semiconductor wafers are subjected to numerous complicated processes in order to impress upon them the desired characteristics. For example, a typical silicon wafer is subjected to extreme temperature and pressure variations during the deposition process. Although semiconductor fabrication has developed into a highly complex scientific craft, the process still retains an art-like nature in that each wafer which passes through the fabrication process tends to have different characteristics compared to the others. In fact, even within a single wafer, each die tends to develop different performance characteristics from its neighbors which were seemingly produced in an identical manner.

After a wafer of dies has been processed, the dies are separated and placed in device housings. The resulting integrated circuits retain the variations in performance characteristics inherent in the die from which they are created. Therefore, in a typical integrated circuit environment, integrated circuits are qualification tested in order to determine the device characteristics. The integrated circuits that have the best performance characteristics may be used in the most demanding environments. The integrated circuits with lower performance characteristics may be used in more cost-sensitive, less demanding applications.

The process of determining the performance characteristics of an integrated circuit is called qualification testing. For example, qualification testing is used to determine the performance of memory chips. A typical memory chip is comprised of millions of memory locations. Qualification testing can be used to determine whether each memory location on a newly fabricated memory chip is capable of accurately storing a bit of data. Even if less than all of the memory locations are functioning, the device is still useful in many applications. Therefore, a memory qualification process may determine the number of properly operating memory locations available on a memory device.

A device qualification process is typically simultaneously executed on a batch of integrated circuits. The performance characteristic categorization is referred to as a binout. Thus, fully functional devices binout as the highest performance devices. The reduced functionality devices binout in one or more categories of lower performance devices. Unfunctioning devices binout as rejected devices.

When a new qualification test is developed, it is critical that it provides proper device binout categorization before it is used for large scale production purposes. If the qualification test is mis-functioning, fully functional devices may be erroneously sold at a reduced price. Likewise, partially performing devices may be used in high performance applications in which the devices will fail.

The introduction of new qualification test software is inevitable. New qualification test software may be developed in order to perform more extensive tests or to increase the speed at which testing is performed. Before new qualification tests are used in the production environment, they themselves must be tested in order to assure that they are properly binning devices. However, determining the proper operation of a qualification test is not straight forward.

According to the prior art, two side by side test set ups are used to test a new qualification process. First, a functioning test process is performed in a first tester. The resulting binouts are stored. Then, the same devices are removed from the first tester and placed in the second tester. The devices are subjected to the trial testing process and the resulting binouts are stored. An attempt is made to determine whether the trial process is properly functioning by comparing the resulting binouts. For example, whenever a device is categorized differently by the known and the trial testing process, the device may be singled out as the subject of further testing to determine the cause of the variation.

Such testing has inherent disadvantages. Variations in the physical testers may cause variations in the binouts which are independent of the functioning of the trial testing process. In addition, the process of moving the devices from one tester to another may damage one or more of the devices causing a variation in the binouts which is independent of the functioning of the trial testing process. In addition, the process is time consuming and operator intensive.

Therefore, there has been a long felt need in the industry to have a means and method of providing reliable testing of qualification test software.

SUMMARY OF THE INVENTION

A batch of devices is placed into the handler of a tester. A known qualification test is executed on the batch producing a first resulting binout determination for each device. Without displacing the devices, a second trial qualification test is executed on the same batch producing a second resulting binout determination for each device. The first and second resulting binout determinations are compared. If the second binout matches the first binout, the device is binned as a correlating device. If the second binout rates the device better than the first binout, the device is binned as an upgraded device. If the second binout rates the device lower than the first binout, the device is binned as a downgraded device. The upgraded and downgraded devices may be examined to determine the differences between the known qualification test and the trial qualification test.

In this way, reliable test results are generated which can be used to determine whether the trial qualification test is operating in a desired manner.

BRIEF DESCRIPTION OF THE DRAWINGS

The features, objectives, and advantages of the invention will become more apparent from the detailed description set forth below when taken in conjunction with the drawings.

DETAILED DESCRIPTION OF THE INVENTION

Figure 1:
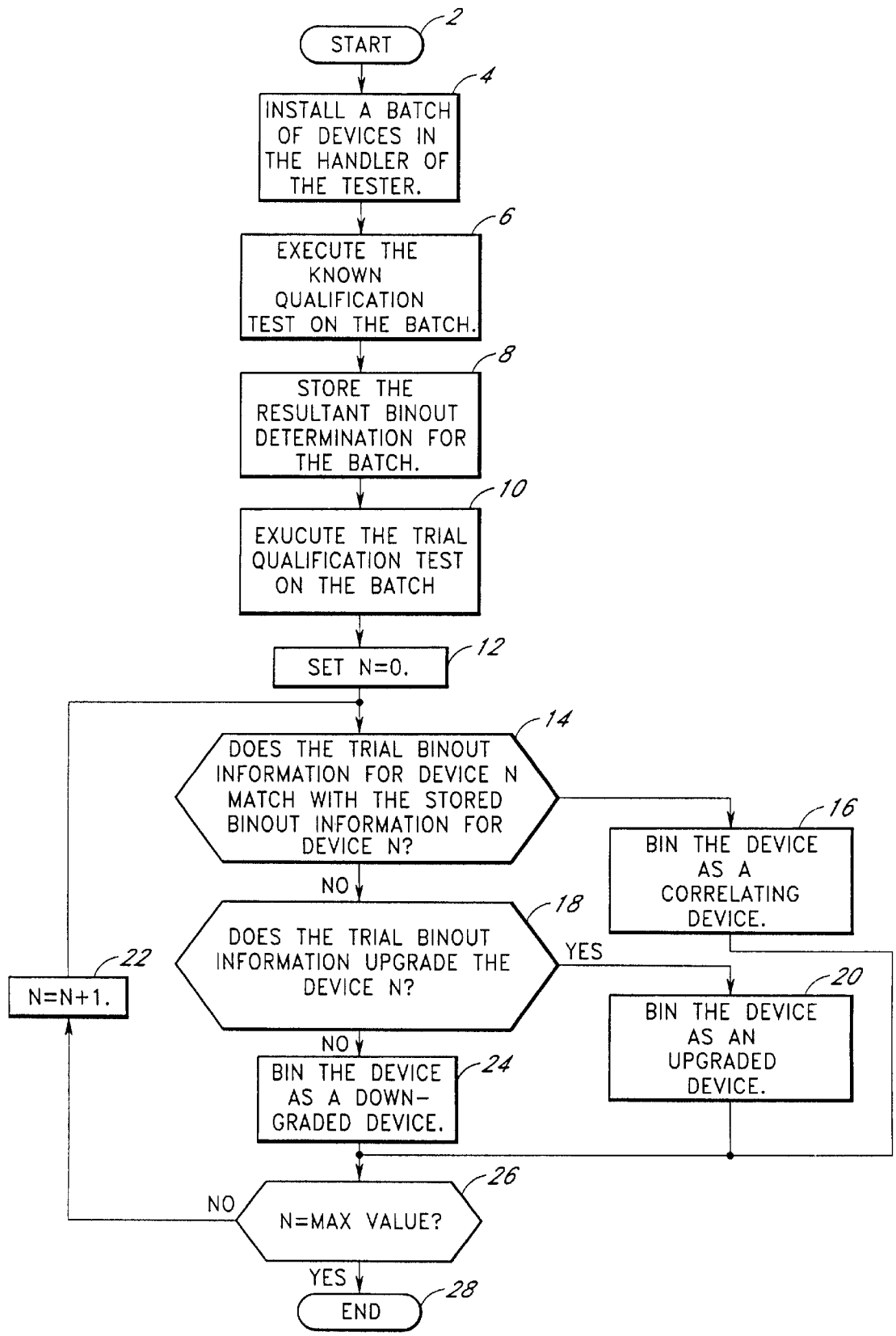
FIG. 1 is a flow chart showing operation in accordance with the invention.

The process of determining the performance characteristics of an integrated circuit through qualification testing is an important step in the production of integrated circuits. Fully functioning parts may be sold for a premium or used in the most demanding applications. Integrated circuits with lower performance results may be used in more cost sensitive or less demanding applications. The performance characteristics which are determined by the qualification process vary depending on the type of integrated circuit which is subject to the testing.

For example, memory integrated circuits are often categorized by the number of working memory locations which are available on the integrated circuit. In particular, common memory integrated circuits are presently designed to hold more than four millions bits of data. In some cases, a portion of those memory locations may not function. If one-half of the memory is not functioning, the memory chip is still capable of storing two million bits of data. There are many applications in which two million bits of data are sufficient. Therefore, the less than fully functional parts still have economic value. However, the fully functional units have the most economic value. Therefore, it is advantageous to separate the fully functional integrated circuits from the reduced functionality integrated circuits.

In order to determine the performance characteristics of a memory integrated circuit, qualification tests are run. Typically, these tests are executed by writing a series of data to each available memory address. Subsequently, the stored data is recalled and compared with the value which was attempted to be stored. If the values are the same, then the memory location is assumed to be functioning. If the values are not the same, then the memory is assumed to be misfunctioning.

Memory qualification programs may read to and write from the memory locations using a variety of patternistic or random schemes. If the device architecture is known, a specially tailored qualification program may be used which is likely to detect known failure modes.

In the production test environment, new testing methods are often under development in order to increase the efficiencies of production tests and to increase the probability of detecting failure modes. If a new failure mode is discovered, the testing method may be changed in order to accurately detect the failure mode. In addition, the testing method may be changed in order to increase the speed at which the qualification test is executed. Each time a change is made to the qualification test, the qualification test itself must be verified before being implemented in a mass production environment. If the qualification test is not operating properly, significant adverse effects may occur. For example, if the qualification test is malfunctioning, fully functional parts may be erroneously categorized as partially performing parts, thus resulting in an economic loss for the memory manufacturer. Likewise, if the qualification test is malfunctioning, partially performing parts may be erroneously categorized as high-performance parts. These parts are likely to fail in high performance applications.

The invention comprises a means and method for evaluating a trial qualification test. Because the failure modes of semiconductor devices are probabilistic, it is often difficult to determine whether a newly developed device test is properly operating unless the test is performed on a number of different devices with a number of different failure modes. In some cases, such as when a new qualification test is developed in order to increase the speed at which qualification testing is performed, the goal is that the trial qualification test and the known qualification test produce the same result. In other cases, such as when a new qualification test is developed to detect a newly discovered failure mode, the goal is that the trial qualification test and the known qualification test produce differing results.

In either case, information regarding the operating characteristics of the new qualification test can be determined by examining those semiconductor parts which are categorized differently by a known qualification test and a new qualification test. For example, if a known and new qualification test categorize a device the same, very little information concerning the operation of either test may be obtained by examination of the part. However, if the known qualification test categories a microprocessor chip as capable of operating at a first maximum clock speed and the new qualification test categories the same part as capable of operating at a second maximum clock speed, information regarding the difference between the qualification tests may be obtained by examining the operation of the part.

Other factors aside from the qualification tests may affect the categorization of parts. For example, different device handlers and different device locations within a single device handler may have different characters due to difference in things such as stray capacitance, line terminations and the like. These difference may cause identically operating parts to produce differing performance characteristics and, therefore, to be erroneously categorized in different categories.

The process of examining the parts which are categorized differently can require an intensive and detailed examination of the part. Such process are expensive and time consuming. For this reason, it is important that the devices which are examined to determine the difference between the qualification tests have inherent characteristics to which the differing test results may be attributed. The introduction of extraneous factor which may affect the categorization of parts may also lead to the unnecessary consumption of testing resources. Therefore, the process of identifying those part which are categorized differently because of inherent operating properties is a factor in operating an efficient testing system. The invention operates to reduce the introduction of extraneous factor which may affect the categorization of parts to produce more reliable testing.

Figure 2:
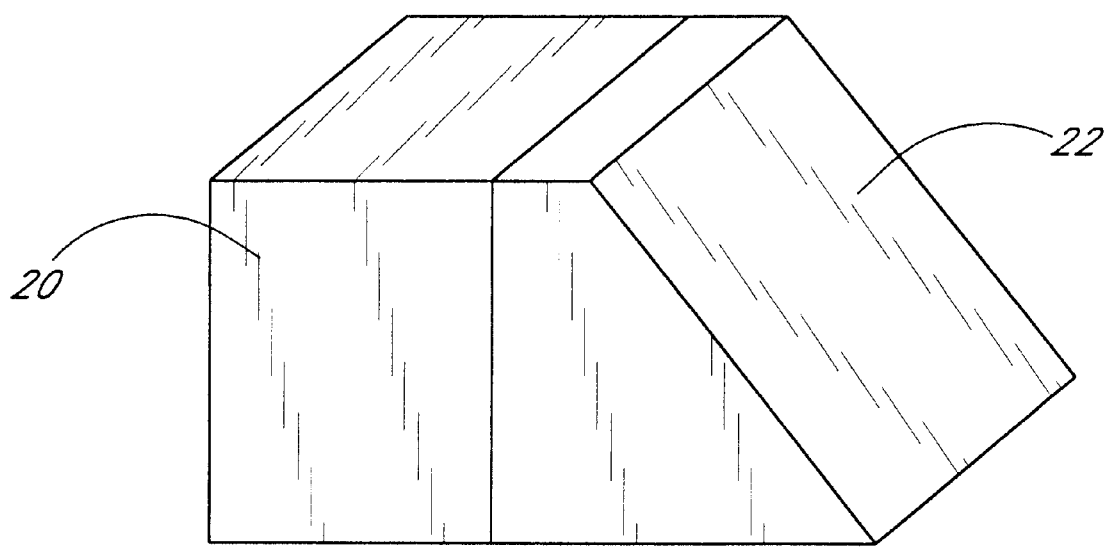
FIG. 2 is a block diagram of a tester.

FIG. 1 is a flowchart showing exemplary operation in accordance with the invention. Operation in accordance with FIG. 1 overcomes the disadvantages of the prior art by reducing the number of extraneous factors which may affect the testing of the qualification process. Process flow begins in start block 2. In block 4, a batch of devices is installed into the handler 22 of a tester 20 (FIG. 2). The devices may be packaged in surface mount package or through-hole packages such as dual in-line packaging. In order to increase the production test efficiency, integrated circuits are typically tested in batches. A batch of devices is physically placed into the handler either by a human operator or by mechanical means. In block 6, the known qualification test is executed on the batch of devices. The known qualification test is used to categorize the devices into one or more categories. For example, the known qualification test may categorize the devices as fully functional, partially functional, or nonfunctional parts. This process is known as binout.

In block 8, the resulting binout determination from the known qualification test is stored. Without removing the batch of devices from the handler, in block 10 the trial qualification test is executed on the same batch. The trial qualification test is the new qualification test which is verified by this process. In block 12, a variable "n" is set to an initial value. "n" is used to increment the comparison process so that the comparison process is executed for each device in the batch.

Block 14 determines whether the trial binout information for part "n" matches the stored binout information for part "n". If the binout information matches, the device is binned as a correlating part in block 16. If the binout information does not match, block 18 determines whether the trial qualification test categorized the device more favorably than the known qualification test. If so, the device is binned as an upgraded part in block 20. If not, the device is binned as a downgraded part in block 24. Flow continues from blocks 16, 20 and 24 to block 26. Block 26 determines whether the comparison process has been executed for every device in the current batch. If not, the device count variable "n" is incremented in block 22 and process flow continues with block 14. When the comparison process has been executed for each device in the batch, process flow ends in block 28.

The results of the process just described are at least three sets of devices: correlated parts, upgraded parts and downgraded parts. If the qualification process categorizes parts in more than two functional categories, more than three categories of parts may result from the comparison process.

The categorized parts can be used to debug the trial qualification test. As noted above, typical debugging processes focus on the upgraded and downgraded parts because these parts are more likely to illuminate the differences between the known qualification test and the trial qualification test.

Many variations to the above example will be obvious to one skilled in the art For example, the qualification process may be executed on other types of integrated circuits besides memory integrated circuits. In addition, other performance characteristics may be categorized by the qualification process. For example, devices may be categorized according to speed, input voltage range tolerance, performance over temperature as well as many other characteristics.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A device test set up comprising:

a handler which holds a batch of devices during test; and a testing program which executes a known qualification test on said batch of devices to determine a first resultant binout, executes a trial qualification test on said batch of devices to determine a second resultant binout, and compares said first resultant binout to said second resultant binout for each device of said batch of devices.

2. The test set up of claim 1 wherein said testing program categorizes each device of said batch of devices as either a correlating part, an upgraded part or a downgraded part.

3. The test set up of claim 2 wherein said testing program further examines a first device categorized as one of said upgraded parts to determine a difference between said known qualification test and said trial qualification test.

4. The test set up of claim 2 wherein said testing program further examines a first device categorized as one of said downgraded parts to determine a difference between said known qualification test and said trial qualification test.

5. The test set up of claim 1 wherein said testing program writes a series of data bits to a first device of said batch of devices, reads a stored series of data bits from said first device, and compares said series of data bits written to said first device and said stored series of data bits.

6. The test set up of claim 1 wherein first resultant binout and said second resultant binout categorize said batch of devices according to a number of functioning memory locations.

7. The test set up of claim 1 wherein first resultant binout and said second resultant binout categorize said batch of devices according to speed of operation.

8. The test set up of claim 1 wherein first resultant binout and said second resultant binout categorize said batch of devices according to a temperature range of operation.

9. The test set up of claim 1 wherein first resultant binout and said second resultant binout categorize said batch of devices according to input voltage range.

10. The test set up of claim 1 wherein said batch of devices comprises integrated circuits in dual in-line packages.

11. The test set up of claim 1 wherein said batch of devices comprises microprocessors.

12. The test set up of claim 1 wherein said batch of devices comprises memory integrated circuits.

13. A program storage device storing instructions that when executed by a computer perform the method comprising:

executing a known qualification test on a batch of devices in a handler of a tester to determine a first resultant binout;

executing a trial qualification test on said batch of devices in said handler of said tester to determine a second resultant binout; and comparing said first resultant binout to said second resultant binout for each device of said batch of devices.

14. The program storage device of claim 13 which further stores instructions that when executed by a computer perform the method comprising:

categorizing each device of said batch as an upgraded part, a correlating part, or a downgraded part; and examining a first device categorized as one of said downgraded parts.

15. The program storage device of claim 13 which further stores instructions that when executed by a computer perform the method comprising examining a first device categorized as one of said downgraded parts to determine a difference between said known qualification test and said trial qualification test.

* * * * *